(12) United States Patent
Khlat (10) Patent No.: US 11,545,945 B2
(45) Date of Patent: Jan. 3, 2023

(54) APPARATUS AND METHOD FOR CALIBRATING AN ENVELOPE TRACKING LOOKUP TABLE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 79 days.

(21) Appl. No.: 17/163,685

(22) Filed: Feb. 1, 2021

(65) Prior Publication Data

US 2021/0281228 A1    Sep. 9, 2021

Related U.S. Application Data

(60) Provisional application No. 62/984,824, filed on Mar. 4, 2020.

(51) Int. Cl.
*H03F 1/30* (2006.01)
*H03F 3/24* (2006.01)
*H03F 1/02* (2006.01)

(52) U.S. Cl.
CPC ........... *H03F 3/245* (2013.01); *H03F 1/0227* (2013.01); *H03F 2200/102* (2013.01); *H03F 2200/336* (2013.01); *H03F 2200/451* (2013.01)

(58) Field of Classification Search
CPC .................................... H03F 1/30; H03G 3/20
USPC ......................................... 330/297, 129, 136
See application file for complete search history.

(56) References Cited

U.S. PATENT DOCUMENTS

| | | | |
|---|---|---|---|
| 5,507,171 A | 4/1996 | Mattes et al. | |
| 6,032,109 A | 2/2000 | Ritmiller, III | |
| 6,556,077 B2 | 4/2003 | Schaffer et al. | |
| 6,724,202 B2 | 4/2004 | Tanizawa | |
| 7,616,062 B2 | 11/2009 | Miyamoto et al. | |
| 8,433,263 B2* | 4/2013 | Pratt | H03F 1/3247 455/127.1 |
| 9,190,959 B2* | 11/2015 | Camuffo | H03F 1/0233 |
| 9,288,098 B2* | 3/2016 | Yan | H04B 1/0475 |

(Continued)

FOREIGN PATENT DOCUMENTS

JP        S601915 A        1/1985

OTHER PUBLICATIONS

U.S. Appl. No. 17/142,350, filed Jan. 6, 2021.

(Continued)

*Primary Examiner* — Henry Choe
(74) *Attorney, Agent, or Firm* — Withrow & Terranova, P.L.L.C.

(57) ABSTRACT

An apparatus and method for calibrating an envelope tracking (ET) lookup table (LUT) are provided. An ET power management apparatus includes a power amplifier configured to amplify a radio frequency (RF) signal from a time-variant input power to a time-variant output power linearly related to the time-variant input power. A calibration circuit is employed to receive a time-variant output power feedback nonlinearly related to the time-variant input power, determine a linear relationship between the time-variant input power and the time-variant output power based on the time-variant output power feedback, and calibrate the ET LUT based on the determined linear relationship. As a result, it is possible to improve accuracy of the ET LUT to thereby improve operating efficiency and linearity of the power amplifier.

18 Claims, 4 Drawing Sheets

(56) References Cited

U.S. PATENT DOCUMENTS

2007/0290748 A1* 12/2007 Woo ..................... H04L 27/361
                                                                 330/149
2011/0136452 A1*  6/2011 Pratt .................... H03F 1/3241
                                                                 455/127.1

OTHER PUBLICATIONS

U.S. Appl. No. 17/142,507, filed Jan. 6, 2021.
Ying, K. et al., "A Wideband Envelope Detector with Low Ripple and High Detection Speed," IEEE International Symposium on Circuits and Systems (ISCAS), May 27-30, 2018, Florence, Italy, IEEE, 5 pages.
Non-Final Office Action for U.S. Appl. No. 17/142,350, dated Sep. 15, 2022, 9 pages.
Non-Final Office Action for U.S. Appl. No. 17/142,507, dated Aug. 17, 2022, 6 pages.

* cited by examiner

APPARATUS AND METHOD FOR CALIBRATING AN ENVELOPE TRACKING LOOKUP TABLE

RELATED APPLICATIONS

This application claims the benefit of provisional patent application Ser. No. 62/984,824, filed Mar. 4, 2020, the disclosure of which is hereby incorporated herein by reference in its entirety.

FIELD OF THE DISCLOSURE

The technology of the disclosure relates generally to calibration of an envelope tracking (ET) lookup table (LUT).

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve operating efficiency and linearity of PAs to help reduce power consumption and thermal dissipation. As the name suggests, an envelope tracking system keeps track of an input power envelope of the RF signals and continuously adjusts a supply voltage applied to the PAs based on the input power envelope. Typically, the envelope tracking system relies on a lookup table (LUT) to correlate the input power envelope with the supply voltage. In this regard, the LUT determines how well the supply voltage tracks the input power envelope and how efficient the PAs can operate. As such, it is desirable to improve accuracy of the LUT to thereby improve operating efficiency and linearity of PAs.

SUMMARY

Aspects disclosed in the detailed description include an apparatus and method for calibrating an envelope tracking (ET) lookup table (LUT). In examples disclosed herein, an ET power management apparatus can calibrate an ET LUT without being coupled to an antenna(s). The ET power management apparatus includes a power amplifier configured to amplify a radio frequency (RF) signal from a time-variant input power to a time-variant output power linearly related to the time-variant input power. A calibration circuit is employed to receive a time-variant output power feedback nonlinearly related to the time-variant input power, determine a linear relationship between the time-variant input power and the time-variant output power based on the time-variant output power feedback, and calibrate the ET LUT based on the determined linear relationship. As a result, it is possible to improve accuracy of the ET LUT to thereby improve operating efficiency and linearity of the power amplifier.

In one aspect, an ET power amplifier apparatus is provided. The ET power amplifier apparatus includes a power amplifier configured to amplify an RF signal from a time-variant input power to a time-variant output power linearly related to the time-variant input power based on a time-variant ET voltage tracking the time-variant input power. The ET power amplifier apparatus also includes a power management integrated circuit (PMIC). The PMIC includes a target voltage circuit configured to generate a time-variant ET target voltage based on an ET LUT that correlates the time-variant input power with the time-variant ET target voltage. The PMIC also includes an ET voltage circuit configured to generate the time-variant ET voltage based on the time-variant ET target voltage. The PMIC also includes a calibration circuit. The calibration circuit is configured to receive a time-variant output power feedback nonlinearly related to the time-variant input power. The calibration circuit is also configured to determine a linear relationship between the time-variant input power and the time-variant output power based on the time-variant output power feedback. The calibration circuit is configured to calibrate the ET LUT based on the determined linear relationship.

In another aspect, a method for calibrating an ET LUT is provided. The method includes amplifying an RF signal from a time-variant input power to a time-variant output power linearly related to the time-variant input power based on a time-variant ET voltage tracking the time-variant input power. The method also includes generating a time-variant ET target voltage based on an ET LUT that correlates the time-variant input power with the time-variant ET target voltage. The method also includes generating the time-variant ET voltage based on the time-variant ET target voltage. The method also includes receiving a time-variant output power feedback nonlinearly related to the time-variant input power. The method also includes determining a linear relationship between the time-variant input power and the time-variant output power based on the time-variant output power feedback. The method also includes calibrating the ET LUT based on the determined linear relationship.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an apparatus and method for calibrating an envelope tracking (ET) lookup table (LUT). In examples disclosed herein, an ET power management apparatus can calibrate an ET LUT without being coupled to an antenna(s). The ET power management apparatus includes a power amplifier configured to amplify a radio frequency (RF) signal from a time-variant input power to a time-variant output power linearly related to the time-variant input power. A calibration circuit is employed to receive a time-variant output power feedback nonlinearly related to the time-variant input power, determine a linear relationship between the time-variant input power and the time-variant output power based on the time-variant output power feedback, and calibrate the ET LUT based on the determined linear relationship. As a result, it is possible to improve accuracy of the ET LUT to thereby improve operating efficiency and linearity of the power amplifier.

Figure 1:
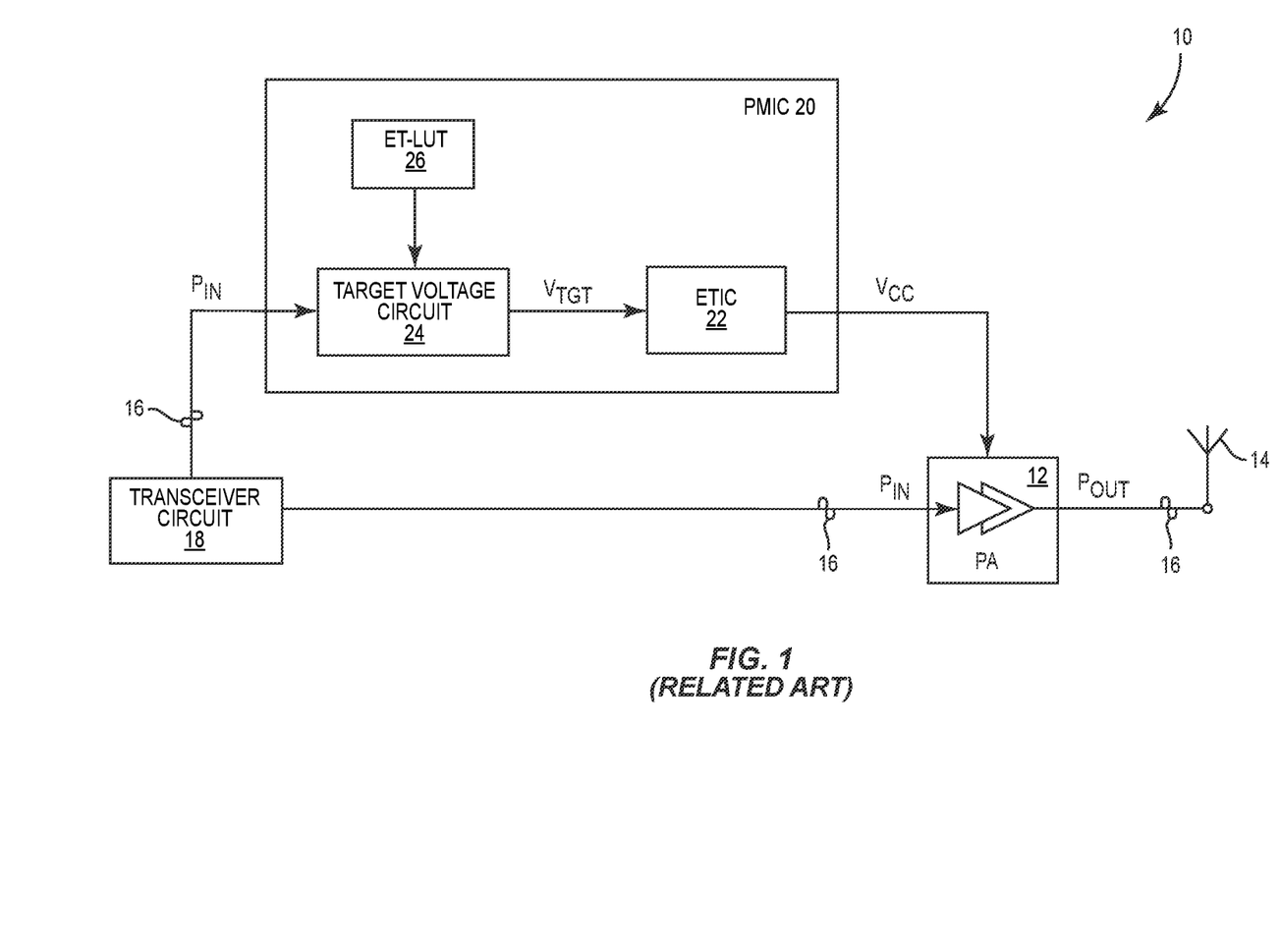
FIG. 1 is a schematic diagram of an exemplary existing envelope tracking (ET) power management apparatus that is incapable of performing ET lookup table (LUT) calibration.
Figure 2:
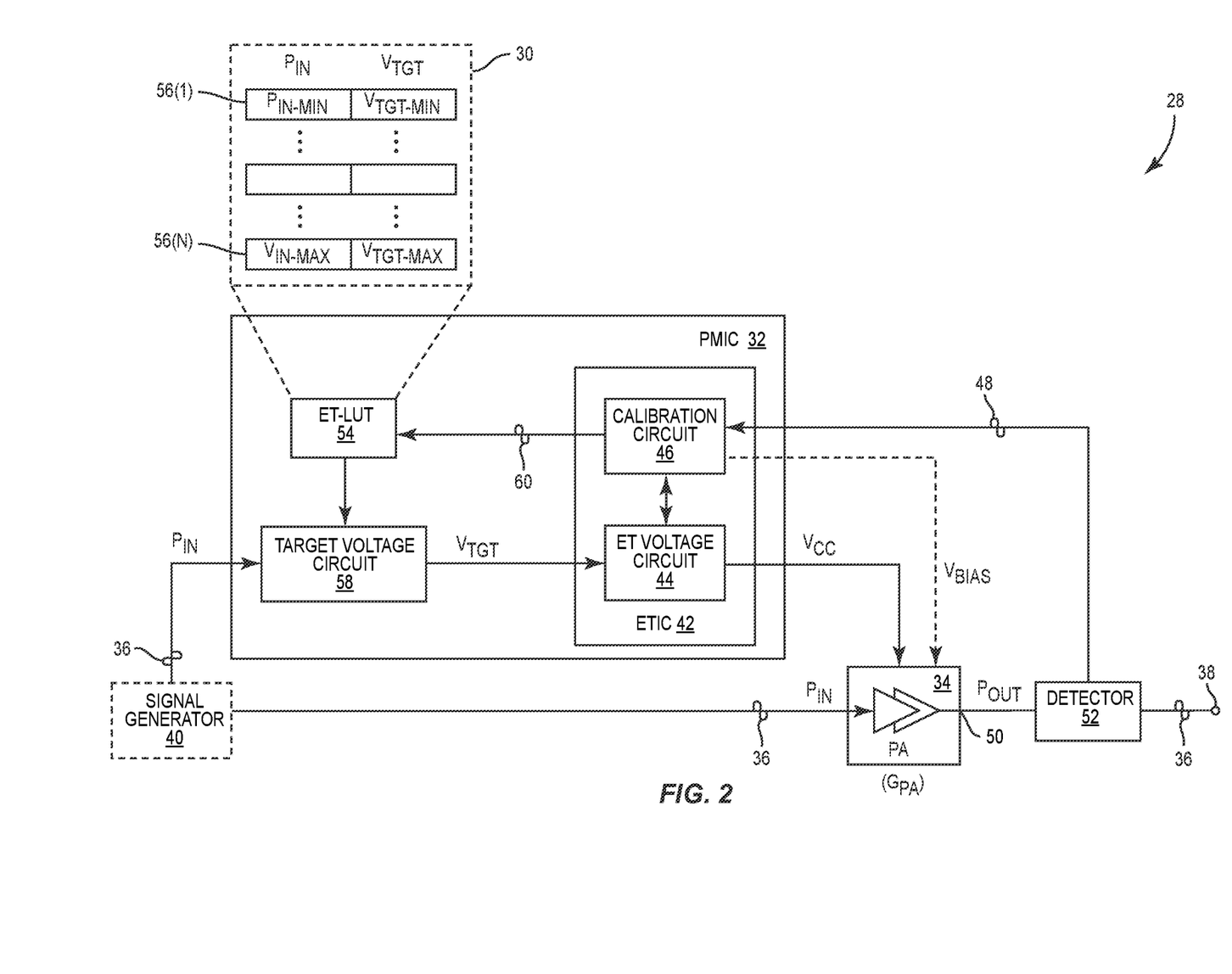
FIG. 2 is a schematic diagram of an ET power management apparatus configured according to an embodiment of the present disclosure to support ET LUT calibration.

Before discussing the ET power management apparatus of the present disclosure, starting at FIG. 2, a brief overview of an existing ET power management apparatus is first provided with reference to FIG. 1.

FIG. 1 is a schematic diagram of an exemplary existing ET power management apparatus 10 that is incapable of performing ET LUT calibration. The existing ET power management apparatus 10 includes a power amplifier 12 coupled to an antenna 14. The power amplifier 12 is configured to amplify an RF signal 16 from a time-variant input power $P_{IN}$ to a time-variant output power $P_{OUT}$ based on a time-variant ET voltage $V_{CC}$ so generated to track the time-variant input power $P_{IN}$. The existing ET power management apparatus 10 may be coupled to a transceiver circuit 18 configured to generate the RF signal 16.

The existing ET power management apparatus 10 includes a power management integrated circuit (PMIC) 20. The PMIC 20 includes an ET integrated circuit (ETIC) 22 configured to generate the time-variant ET voltage $V_{CC}$ based on a time-variant ET target voltage $V_{TGT}$. The PMIC 20 also includes a target voltage circuit 24 configured to generate the time-variant ET target voltage $V_{TGT}$ to track the time-variant input power $P_{IN}$ of the RF signal 16. The PMIC 20 may include a memory circuit 26 that stores an ET LUT, which correlates the time-variant input power $P_{IN}$ with the time-variant ET target voltage $V_{TGT}$. In this regard, the target voltage circuit 24 can generate the time-variant ET target voltage $V_{TGT}$ based on the ET LUT. The phrase "time-variant" is used hereinafter to describe a time-dependent variable (e.g., power, voltage, current) that changes from time to time.

The ET LUT may be predetermined based on a set of assumed characteristics (e.g., efficiency, isogain, impedance, coupling distance, etc.) of the power amplifier 12. However, when the PMIC 20 is actually coupled to the power amplifier 12 in the existing ET power management apparatus 10, the assumed characteristics may be subject to change. As such, it may be necessary to calibrate the ET LUT when the PMIC 20 is coupled to the power amplifier 12 to correct any misalignment between the time-variant input power $P_{IN}$ and the time-variant ET target voltage $V_{TGT}$. Moreover, it is desirable to perform the ET LUT calibration in a factory test without actually coupling the power amplifier 12 to the antenna 14.

In this regard, FIG. 2 is a schematic diagram of an ET power management apparatus 28 configured according to an embodiment of the present disclosure to calibrate an ET LUT 30. The ET power management apparatus 28 includes a PMIC 32 configured to provide a time-variant ET voltage $V_{CC}$ to a power amplifier 34 for amplifying an RF signal 36 from a time-variant input power $P_{IN}$ to a time-variant output power $P_{OUT}$. Notably, the power amplifier 34 can be any type of power amplifier (e.g., differential power amplifier, multi-stage power amplifier, single-stage power amplifier) having a power amplifier gain $G_{PA}$ (e.g., isogain). As such, the power amplifier 34 can produce the time-variant output power $P_{OUT}$ that is linearly related to the time-variant input power $P_{IN}$ based on the power amplifier gain $G_{PA}$ ($P_{OUT}=G_{PA}*P_{IN}$). In other words, there exists a linear relationship between the time-variant input power $P_{IN}$ and the time-variant output power $P_{OUT}$.

In embodiments disclosed herein, the ET power management apparatus 28 is configured to calibrate the ET LUT 30 (e.g., in a factory test) without requiring any antenna being coupled to an antenna port 38. In this regard, the RF signal 36 may be provided by a signal generator 40 as a continuous wave (CW) signal.

The PMIC 32 includes an ETIC 42, which includes an ET voltage circuit 44 configured to generate the time-variant ET voltage $V_{CC}$ based on a time-variant ET target voltage $V_{TGT}$. The ETIC 42 includes a calibration circuit 46, which can be a field-programmable gate array (FPGA), as an example. Notably, the calibration circuit 46 can be implemented either by adding a new circuit to the ETIC 42 or reusing an existing control circuit in the ETIC 42.

The calibration circuit 46 is configured to receive a time-variant output power feedback 48, which can be an indication of power, current, and/or voltage at an output 50 of the power amplifier 34. In a non-limiting example, the time-variant output power feedback 48 can be provided by a detector 52 coupled between the output 50 and the antenna port 38. Alternatively, the detector 52 can also be provided as part of the power amplifier 34. The detector 52 has a nonlinear response to an input signal due to inherent nonlinear characteristics. As a result, the time-variant output power feedback 48 will be nonlinearly related to the time-variant output power $P_{OUT}$ as well as the time-variant input power $P_{IN}$.

As discussed in detail below, the calibration circuit 46 can be configured to determine the linear relationship between the time-variant input power $P_{IN}$ and the time-variant output power $P_{OUT}$ based on the time-variant output power feedback 48 and calibrate the ET LUT 30 based on the determined linear relationship. As a result, it is possible to improve accuracy of the ET LUT 30 to thereby improve operating efficiency and linearity of the power amplifier 34.

The PMIC 32 can be configured to store the ET LUT 30 in a memory circuit 54. In a non-limiting example, the ET LUT 30 includes multiple rows 56(1)-56(N) each configured to correlate a respective value of the time-variant input power $P_{IN}$ with a respective value of the time-variant ET target voltage $V_{TGT}$. The first row 56(1) in the ET LUT 30 may correspond to a minimum value of the time-variant input power $P_{IN}$ (a.k.a. minimum input power $P_{IN-MIN}$), which may correspond to a minimum value of the time-variant ET target voltage $V_{TGT}$ (a.k.a., minimum ET target voltage $V_{TGT-MIN}$). The last row 56(N) in the ET LUT 30 may correspond to a maximum value of the time-variant input power $P_{IN}$ (a.k.a. maximum input power $P_{IN-MAX}$), which may correspond to a maximum value of the time-variant ET target voltage $V_{TGT}$ (a.k.a., maximum ET target voltage $V_{TGT-MAX}$). The rows 56(1)-56(N-1) correspond to any of the time-variant input power $P_{IN}$ that fall between the minimum input power $P_{IN-MIN}$ and the maximum input power $P_{IN-MAX}$, which may correspond to any of the time-variant ET target voltage $V_{TGT}$ that fall between the minimum ET target voltage $V_{TGT-MIN}$ and the maximum ET target voltage $V_{TGT-MAX}$.

The PMIC 32 can further include a target voltage circuit 58 configured to receive the RF signal 36 associated with the time-variant input power $P_{IN}$ and generate the time-variant ET target voltage $V_{TGT}$. In this regard, the target voltage circuit 58 can map an instantaneous input power of the RF signal 36 to a respective one of the rows 56(1)-56(N) in the ET LUT 30 to determine a respective ET target voltage associated with the time-variant ET target voltage $V_{TGT}$.

The calibration circuit 46 may be configured to calibrate the ET LUT 30 according to a two-step calibration process. In the first step of the calibration process, the calibration circuit 46 may determine a time-variant nonlinear response of the detector 52. To do so, the calibration circuit 46 may configure the power amplifier 34 to operate in a first state with a flattened power amplifier gain $G_{PA}$ between the minimum input power $P_{IN-MIN}$ and the maximum input power $P_{IN-MAX}$ (also referred to as "a selected input power range").

Figure 3:
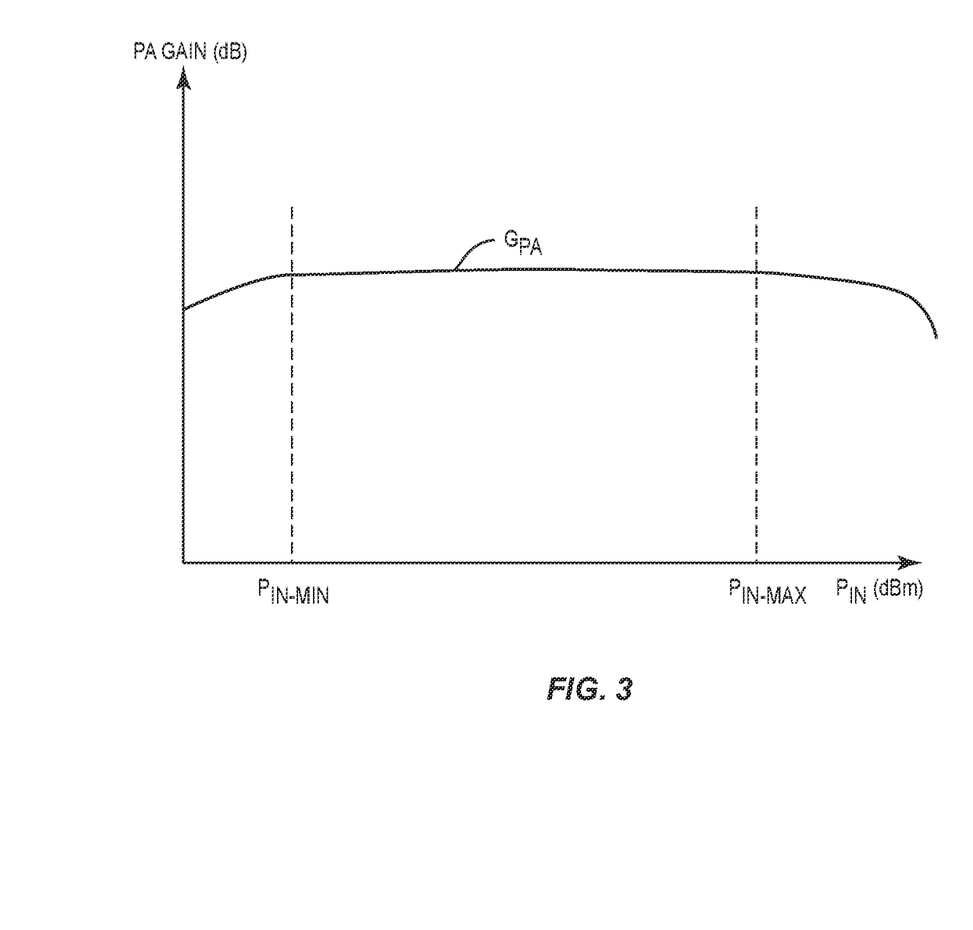
FIG. 3 is a graphic diagram providing an exemplary illustration of a flattened power amplifier gain.

FIG. 3 is a graphic diagram providing an exemplary illustration of the flattened power amplifier gain $G_{PA}$ of the power amplifier 34 when operating in the first state. As shown in FIG. 3, the power amplifier gain $G_{PA}$ of the power amplifier 34 is nearly flat between the minimum input power $P_{IN-MIN}$ and the maximum input power $P_{IN-MAX}$. As such, the power amplifier 34 will output the time-variant output power $P_{OUT}$ substantially identical to the time-variant input power $P_{IN}$ (e.g., $P_{OUT}=P_{IN}\pm0.2$ dBm) in the selected input power range.

With reference back to FIG. 2, by configuring the power amplifier 34 to produce the flattened power amplifier gain $G_{PA}$, the power amplifier 34 becomes a non-factor when the calibration circuit 46 determines the time-variant nonlinear response of the detector in the selected input power range. In a non-limiting example, the calibration circuit 46 can configure the power amplifier 34 to operate in the first state by controlling the ET voltage circuit 44 to adjust the time-variant ET voltage $V_{CC}$ and/or biasing the power amplifier 34 with a bias voltage $V_{BIAS}$.

After determining the time-variant nonlinear response of the detector 52, the calibration circuit 46 can perform a second step of the calibration process. Specifically, the calibration circuit 46 can configure the power amplifier 34 to operate in a second state with a normal power amplifier gain $G_{PA}$ such that the time-variant output power $P_{OUT}$ is linearly related to the time-variant input power $P_{IN}$ in the selected input power range. In this regard, the calibration circuit 46 can subtract the time-variant nonlinear response, which is determined in the first step of the calibration process, from the time-variant output power feedback 48 to determine the time-variant output power $P_{OUT}$ in the selected input power range. Accordingly, the calibration circuit 46 can determine a time-variant calibrated ET target voltage 60 linearly related to the time-variant output power $P_{IN}$ in the selected input power range and update the ET LUT 30 to correlate the time-variant calibrated ET target voltage 60 with the time-variant input power $P_{IN}$.

Figure 4:
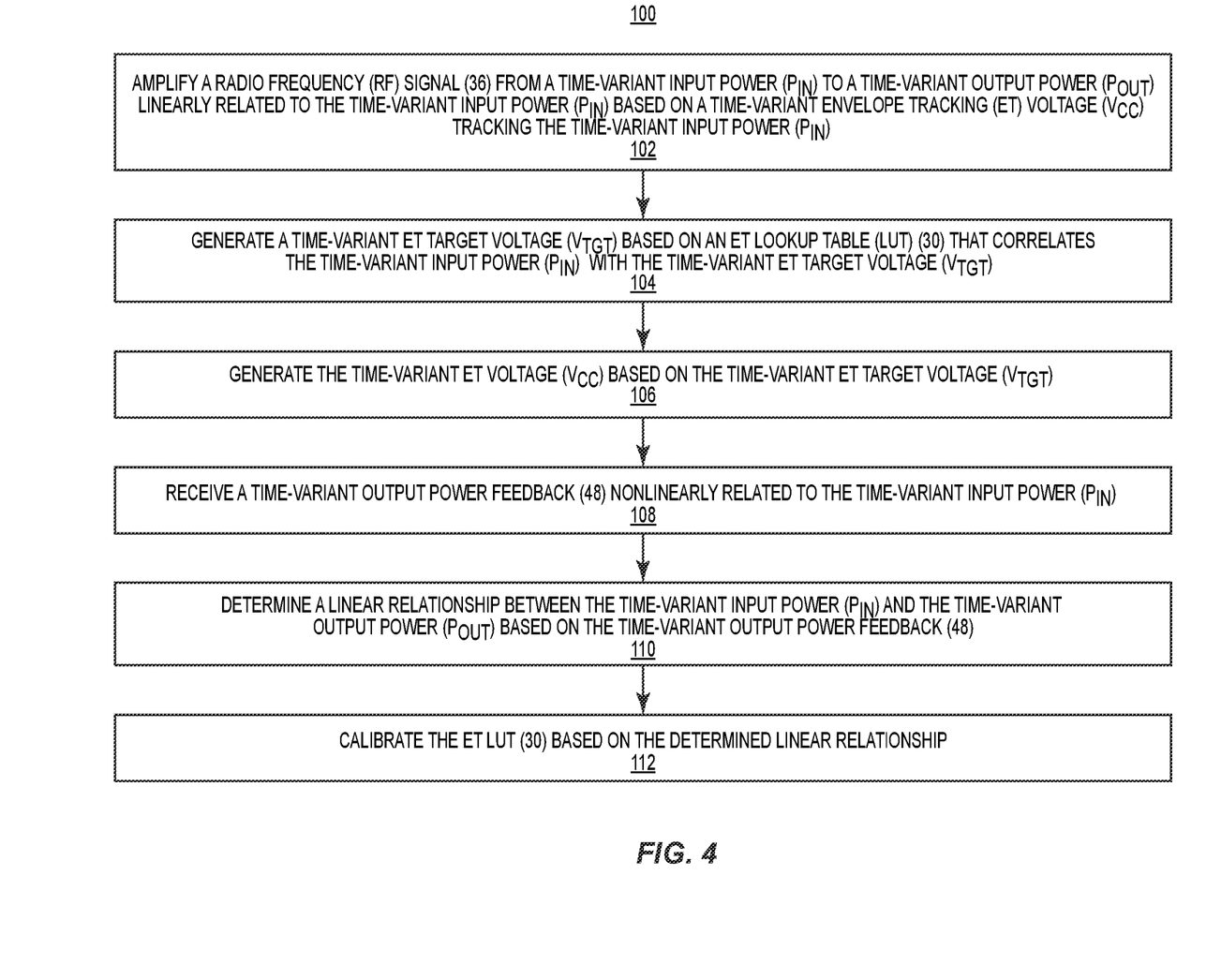
FIG. 4 is a flowchart of an exemplary method for calibrating an ET LUT in the ET power management apparatus of FIG. 2.

The calibration circuit 46 can calibrate the ET LUT 30 according to a process. In this regard, FIG. 4 is a flowchart of an exemplary process 100 that may be performed by the calibration circuit in FIG. 2 to calibrate the ET LUT 30.

The process 100 includes amplifying the RF signal 36 from the time-variant input power $P_{IN}$ to the time-variant output power $P_{OUT}$ linearly related to the time-variant input power $P_{IN}$ based on the time-variant ET voltage $V_{CC}$ tracking the time-variant input power $P_{IN}$ (step 102). The process 100 also includes generating the time-variant ET target voltage $V_{TGT}$ based on the ET LUT 30 that correlates the time-variant input power $P_{IN}$ with the time-variant ET target voltage $V_{TGT}$ (step 104). The process 100 also includes generating the time-variant ET voltage $V_{CC}$ based on the time-variant ET target voltage $V_{TGT}$ (step 106). The process 100 also includes receiving the time-variant output power feedback 48 nonlinearly related to the time-variant input power $P_{IN}$ (step 108). The process 100 also includes determining the linear relationship between the time-variant input power $P_{IN}$ and the time-variant output power $P_{OUT}$ based on the time-variant output power feedback 48 (step 110). The process also includes calibrating the ET LUT 30 based on the determined linear relationship (step 112).

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) power amplifier apparatus comprising:
   a power amplifier configured to amplify a radio frequency (RF) signal from a time-variant input power to a time-variant output power linearly related to the time-variant input power based on a time-variant ET voltage tracking the time-variant input power; and
   a power management integrated circuit (PMIC) comprising:
      a target voltage circuit configured to generate a time-variant ET target voltage based on an ET lookup table (LUT) that correlates the time-variant input power with the time-variant ET target voltage;
      an ET voltage circuit configured to generate the time-variant ET voltage based on the time-variant ET target voltage; and
      a calibration circuit configured to:
         receive a time-variant output power feedback nonlinearly related to the time-variant input power;
         determine a linear relationship between the time-variant input power and the time-variant output power based on the time-variant output power feedback; and
         calibrate the ET LUT based on the determined linear relationship.

2. The ET power management apparatus of claim 1 further comprises a detector coupled between an output of the power amplifier and an antenna port and configured to generate the time-variant output power feedback.

3. The ET power management apparatus of claim 2 wherein the power amplifier comprises the detector.

4. The ET power management apparatus of claim 2 wherein the antenna port is decoupled from an antenna during ET LUT calibration.

5. The ET power management apparatus of claim 2 wherein the calibration circuit is further configured to:
   configure the power amplifier to operate in a first state to amplify the RF signal to the time-variant output power substantially identical to the time-variant input power in a selected input power range; and
   determine a time-variant nonlinear response of the detector in the selected input power range.

6. The ET power management apparatus of claim 5 wherein the selected input power range is bounded by a minimum input power and a maximum input power as defined in the ET LUT.

7. The ET power management apparatus of claim 5 wherein the calibration circuit is further configured to adjust the time-variant ET voltage to cause the power amplifier to operate in the first state.

8. The ET power management apparatus of claim 5 wherein the calibration circuit is further configured to adjust a bias voltage of the power amplifier to cause the power amplifier to operate in the first state.

9. The ET power management apparatus of claim 5 wherein the calibration circuit is further configured to:
   configure the power amplifier to operate in a second state to amplify the RF signal to the time-variant output power linearly related to the time-variant input power in the selected input power range; and
   subtract the time-variant nonlinear response from the time-variant output power feedback to determine the time-variant output power in the selected input power range.

10. The ET power management apparatus of claim 9 wherein the calibration circuit is further configured to:
    determine a time-variant calibrated ET target voltage linearly related to the time-variant output power in the selected input power range; and
    update the ET LUT to correlate the time-variant calibrated ET target voltage with the time-variant input power.

11. The ET power management apparatus of claim 1 further comprising a signal generator configured to generate the RF signal having the time-variant input power.

12. A method for calibrating an envelope tracking (ET) lookup table (LUT) comprising:
    amplifying a radio frequency (RF) signal from a time-variant input power to a time-variant output power linearly related to the time-variant input power based on a time-variant ET voltage tracking the time-variant input power;
    generating a time-variant ET target voltage based on an ET LUT that correlates the time-variant input power with the time-variant ET target voltage;
    generating the time-variant ET voltage based on the time-variant ET target voltage;
    receiving a time-variant output power feedback nonlinearly related to the time-variant input power;
    determining a linear relationship between the time-variant input power and the time-variant output power based on the time-variant output power feedback; and
    calibrating the ET LUT based on the determined linear relationship.

13. The method of claim 12 further comprising receiving the time-variant output power feedback from a detector coupled to an antenna port.

14. The method of claim 13 further comprising decoupling the antenna port from an antenna during ET LUT calibration.

15. The method of claim 13 further comprising:
    operating in a first state to amplify the RF signal to the time-variant output power substantially identical to the time-variant input power in a selected input power range; and
    determining a time-variant nonlinear response of the detector in the selected input power range.

16. The method of claim 15 wherein the selected input power range is bounded by a minimum input power and a maximum input power as defined in the ET LUT.

17. The method of claim 15 further comprising:
operating in a second state to amplify the RF signal to the time-variant output power linearly related to the time-variant input power in the selected input power range; and
subtracting the time-variant nonlinear response from the time-variant output power feedback to determine the time-variant output power in the selected input power range.

18. The method of claim 17 further comprising:
determining a time-variant calibrated ET target voltage linearly related to the time-variant output power in the selected input power range; and
updating the ET LUT to correlate the time-variant calibrated ET target voltage with the time-variant input power.

* * * * *